United States Patent
Hsu et al.

(10) Patent No.: US 8,274,320 B2
(45) Date of Patent: Sep. 25, 2012

(54) SIGNAL PROCESSING CIRCUIT WITH IMPROVED LINEARITY

(75) Inventors: Wei-Hsiu Hsu, Hsinchu Hsien (TW); Shuo Yuan Hsiao, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 126 days.

(21) Appl. No.: 12/838,658

(22) Filed: Jul. 19, 2010

(65) Prior Publication Data

US 2011/0025417 A1    Feb. 3, 2011

(30) Foreign Application Priority Data

Jul. 31, 2009   (TW) .............................. 98125885 A

(51) Int. Cl.
    *G06F 7/44*   (2006.01)
(52) U.S. Cl. ......... 327/356; 326/357; 326/359; 455/333
(58) Field of Classification Search .................. 327/356, 327/357, 359; 455/333
    See application file for complete search history.

(56) References Cited

U.S. PATENT DOCUMENTS

| | | | | |
|---|---|---|---|---|
| 4,937,516 | A * | 6/1990 | Sempel ........................ | 323/315 |
| 5,587,682 | A * | 12/1996 | Colli et al. .................... | 327/357 |
| 7,602,227 | B2 * | 10/2009 | Kim et al. ...................... | 327/359 |
| 7,847,613 | B1 * | 12/2010 | Samavati ....................... | 327/359 |
| 7,973,587 | B2 * | 7/2011 | Yang et al. ..................... | 327/359 |
| 8,019,314 | B2 * | 9/2011 | Tomiyama .................... | 455/323 |
| 8,064,869 | B2 * | 11/2011 | Reis .............................. | 455/318 |

* cited by examiner

*Primary Examiner* — Kenneth B. Wells
(74) *Attorney, Agent, or Firm* — Edell, Shapiro & Finnan, LLC

(57) ABSTRACT

A signal processing circuit includes a differential input circuit, a first DC filter, a second DC filter, a differential transconductance circuit, and a differential converting circuit. The differential input circuit includes first and second input circuits respectively for receiving first and second input signals to generate first and second processed signals. The first DC filter and the second DC filter, respectively coupled to the first and the second input circuits, receive the first and the second processed signals and output first and second voltage signals. The differential transconductance circuit includes first and second transconductance circuits, respectively coupled to the first and the second DC filters, for converting the first and the second voltage signals to first and second current signals. The differential converting circuit includes first and second converting circuits, respectively coupled to the first and the second transconductance circuits, for mixing the first and the second current signals with first and second clock signals to generate first and second output signals.

13 Claims, 8 Drawing Sheets

SIGNAL PROCESSING CIRCUIT WITH IMPROVED LINEARITY

CROSS REFERENCE TO RELATED PATENT APPLICATION

This patent application is based on Taiwan, R.O.C. patent application No. 098125885 filed on Jul. 31, 2009.

FIELD OF THE INVENTION

The present invention relates to a mixer, and more particularly, to a mixer capable of increasing a swing of an input signal and reducing an offset signal.

BACKGROUND OF THE INVENTION

In the wireless communication field, a mixer up-converts a baseband signal to a radio frequency signal by mixing the baseband signal with a high frequency (HF) clock, or down-converts a received signal to a baseband signal for subsequent signal processing. However, when a swing of the baseband signal is beyond a predetermined range, a transconducting circuit cannot linearly convert the signal from a voltage form to a current form.

In a differential system, semiconductor manufacturing process variations results in size mismatch between two corresponding transconducting components and thereby incurring a direct current (DC) offset, which then induces local oscillator (LO) leakage. The LO leakage may lead to deterioration in a receive quality of a communication system.

FIG. 1 shows a circuit of a conventional mixer 100. The mixer 100 comprises a differential input circuit including a first input circuit 102, a second input circuit 104, a first transconductance circuit 106, a second transconductance circuit 108, a first converting circuit 110, and a second converting circuit 112. The first input circuit 102 and the second input circuit 104 respectively receive a first input signal Si1 and a second input signal Si2 to generate a first processed signal Sp1 and a second processed signal Sp2. The first transconductance circuit 106 and the second transconductance circuit 108 respectively transconduct the first processed signal Sp1 and the second processed signal Sp2 to a first current signal Sc1 and a second current signal Sc2. The first converting circuit 110 and the second converting circuit 112 respectively receive the first current signal Sc1 and the second current signal Sc2, and generate a first output signal So1 and a second output signal So2 according to a clock signal Slo. In this embodiment, the first input signal Si1 and the second input signal Si2 are a differential pair, and the first output signal So1 and the second output signal So2 are also a differential pair.

In addition, the first input circuit 102 comprises an operational amplifier 1022, an N-type field effect transistor (FET) M1, and an impedance component 1024 which has an end N1 for receiving a reference voltage Vb. The second input circuit 104 comprises an operational amplifier 1042, an N-type FET M2, and an impedance component 1044 which has an end N2 for receiving the reference voltage Vb. The first transconductance circuit 106 and the second transconductance circuit 108 are respectively realized by N-type FETs M3 and M4. The first converting circuit 110 comprises an N-type FET differential pair M5 and M6, and a first load 1102. The N-type FET differential pair M5 and M6 respectively has its gate for receiving the clock signal Slo. The second converting circuit 112 comprises an N-type FET differential pair M7 and M8, and a second load 1122. The N-type FET differential pair M7 and M8 respectively has its gate for receiving the clock signal Slo. Further, the mixer 100 is operated between a power voltage Vdd1 and a ground voltage Vgnd1. Connections between components of the mixer 100 are as shown in FIG. 1, and shall not be described for brevity.

When the first input signal Si1 is inputted at a load end N3 of the operational amplifier 1022, the first processed signal Sp1 corresponding to the first input signal Si1 is outputted to a gate N5 of the N-type FET M3. The N-type FET M3 transconducts the first processed signal Sp1 to the first current signal Sc1 that is then transmitted to the N-type FET differential pair M5 and M6. At this end, a switch between the N-type FET differential pair M5 and M6 is switched according to the clock signal Slo to respectively output information of the first current signal Sc1 to output ends N6 and N7. Likewise, the second input circuit 104 and the N-type FETs M4, M7 and M8 at the same time respectively output information of the second input signal Si2 to the output ends N6 and N7. In FIG. 1, mismatch between the reference voltage generating circuits 102 and 104, and the transconductance circuits 106 and 108, and the converting circuits 110 and 112 is resulted from the fabrication process. As a result a DC offset is incurred that induces an LO leakage in an LO signal generated at an output end of the mixer 100, such that a receive quality of a communication system is undesirably affected.

Since the first input signal Si1 and the second input signal Si2 are respectively connected to load ends N3 and N8 of the operational amplifiers 1022 and 1024, signal swings of the first input signal Si1 and the second input signal Si2 are respectively limited to a bias voltage range of the operational amplifiers 1022 and 1024 that are in normal operation. Therefore, solutions for issues of improving linearity of the mixer 100, reducing influences of DC offset, and increasing an input signal swing in the wireless communication field need to be provided.

SUMMARY OF THE INVENTION

Therefore, one object of the present invention is to provide a mixer capable of improving linearity of the mixer, reducing influences of DC offset, and increasing an input signal swing.

According to an embodiment of the present invention, a signal processing circuit comprises a differential input circuit, a first DC filter, a second DC filter, a differential transconductance circuit, and a differential converting circuit. The differential input circuit comprises first and second input circuits respectively for receiving a first and a second input signals to generate a first and a second processed signals. The first DC filter and the second DC filter, respectively coupled to the first and the second input circuits, are provided for receiving the first and the second processed signals and outputting a first and a second voltage signals. The differential transconductance circuit comprising first and second transconductance circuits, respectively coupled to the first and the second DC filters, for converting the first and the second voltage signals to first and second current signals. The differential converting circuit comprising first and second converting circuits, respectively coupled to the first and the second transconductance circuits, for mixing the first and the second current signals with first and second clock signals to generate first and second output signals. The first and the second input signals are a differential signal pair, the first and the second clock signals are a differential signal pair, and the first and the second output signals are a differential signal pair.

According to another embodiment of the present invention, a signal processing circuit comprises a first input circuit, a second input circuit, a differential transconductance circuit, and a differential converting circuit. The first input circuit, for receiving a first input signal to generate a first voltage, comprises a first impedance component, comprising a first end coupled to the first input signal and a second end; a first operational amplifier, comprising a first input end coupled to the second end of the first impedance component, a second input end coupled to a first reference voltage, and an output end; and a third transconductance circuit, comprising an input end coupled to the output end of the first operational amplifier and the input end of the first transconductance circuit, and an output end coupled to the second end of the first impedance component. The second input circuit, for receiving a second input signal to generate a second voltage signal, comprises a second impedance component, comprising a first end coupled to the second input signal and a second end.

According to still another embodiment of the present invention, a signal processing circuit comprises a first input circuit, a second input circuit, a differential transconductance circuit, and a differential converting circuit. The first input circuit, for receiving a first input signal to generate a first voltage, comprises a first impedance component, comprising a first end coupled to the first input signal and a second end; a first operational amplifier, comprising a first input end coupled to the second end of the first impedance component, a second input end coupled to a first reference voltage, and an output end; and a third transconductance circuit, comprising an input end coupled to the output end of the first operational amplifier and the input end of the first transconductance circuit, and an output end coupled to the second end of the first impedance component. The second input circuit for receiving a second input signal to generate a second voltage signal, comprises a second impedance component, comprising a first end coupled to the second input signal and a second end; a second operational amplifier, comprising a first input end coupled to the second end of the second impedance component, a second input end coupled to a first reference voltage, and an output end; and a fourth transconductance circuit, comprising an input end coupled to the output end of the second operational amplifier and the input end of the second transconductance circuit, and an output end coupled to the second end of the second impedance component. The differential transconductance circuit comprises a first and a second transconductance circuits, respectively coupled to the output end of the first and the second operational amplifiers, for converting the first and the second voltage signals to a first and a second current signals. The differential converting circuit comprises a first and a second converting circuits, respectively coupled to the first and the second transconductance circuits, for mixing the first and the second current signals with a first and a second clock signals to generate a first and a second output signals. The first and the second input signals are a differential signal pair, the first and the second clock signals are a differential signal pair, and the first and the second output signals are a differential signal pair.

DETAILED DESCRIPTION OF THE PREFERRED EMBODIMENT

Figure 2:
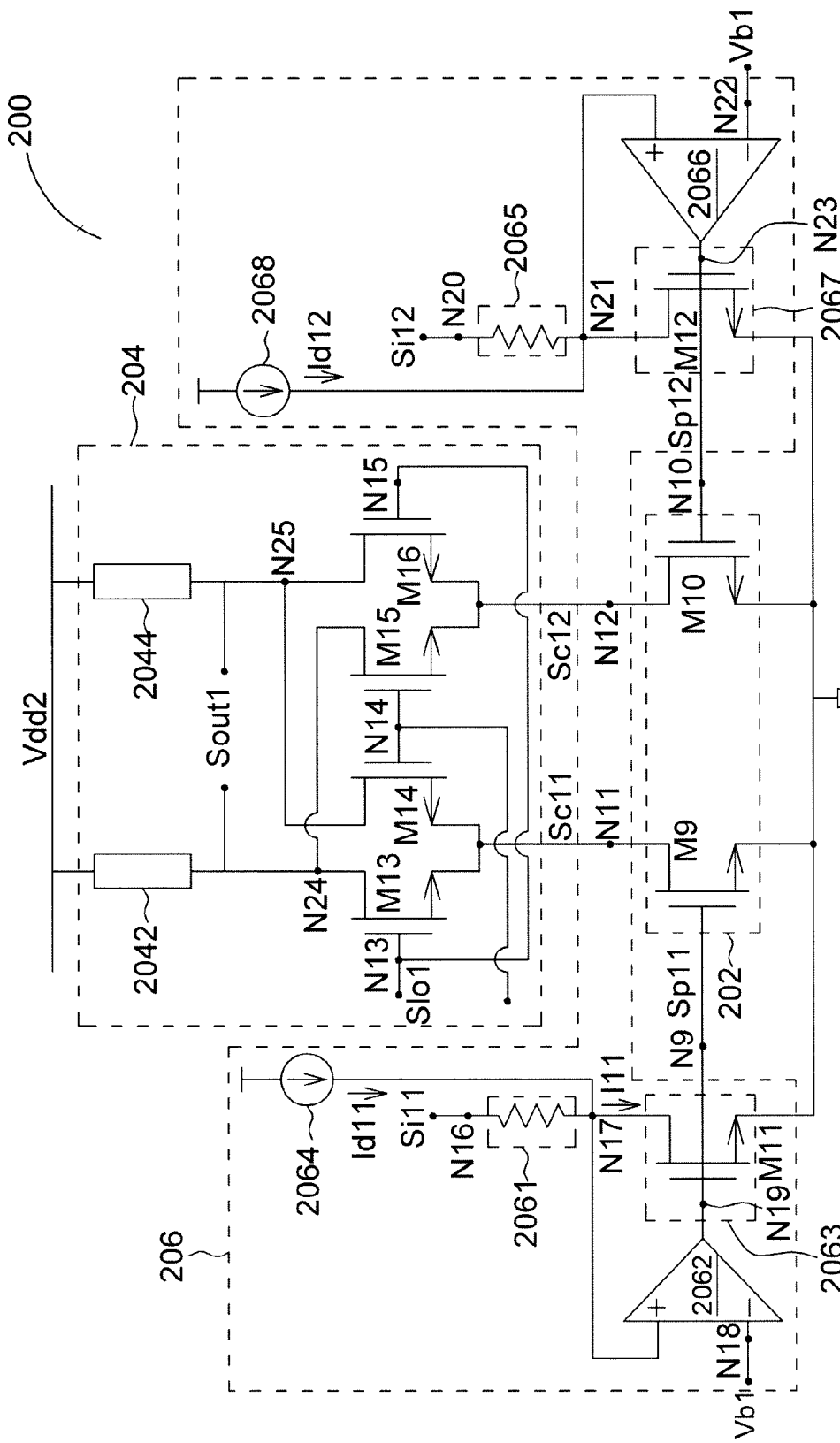
FIG. 2 is a circuit of a mixer in accordance with a first embodiment of the present invention.

FIG. 2 shows a mixer 200 in accordance with an embodiment of the present invention. It is to be noted that, in order to illustrate the spirit of the present invention, the mixer 200 is represented by a differential form; however, it shall not be construed as limiting the present invention. The mixer 200 comprises a transconductance circuit 202, a converting circuit 204, and a differential circuit 206. The transconductance circuit 202 has input ends N9 and N10 for respectively converting a first voltage signal Sp11 and a second voltage signal Sp12 to a first current signal Sc11 and a second current signal Sc12, and output ends N11 and N12 for respectively outputting the first current signal Sc11 and the second current signal Sc12. The transconductance circuit 202 comprises N-type FETs M9 and M10, and connections between the FETs are as shown in FIG. 2. The converting circuit 204 coupled to the output ends N11 and N12 of the transconductance circuit 202 comprises input ports N13, N14 and N15 for receiving a clock signal Slo1 (in this embodiment, the clock signal Slo1 is an LO differential signal), and converts the first current signal Sc11 and the second current signal Sc12 to an output signal Sout1 according to the clock signal Slo1. The differential circuit 206 coupled to the transconductance circuit 202 receives an input signal (comprising differential input signals Si11 and Si12) to generate the first voltage signal Sp11 and the second voltage signal Sp12. The differential circuit 206 comprises a first impedance component 2061, a first operational amplifier 2062, a transconductance circuit 2063, a first reference current generating circuit 2064, a second impedance component 2065, a second operational amplifier 2066, a transconductance circuit 2067, and a second reference current generating circuit 2068. The first impedance component 2061 comprises a first end N16 coupled to the input signal Si11. The first operational amplifier 2062 comprises a first input end (+) coupled to a second end N17 of the first impedance component 2061, and a bias end N18 coupled to a reference voltage Vb1. The transconductance circuit 2063 comprises an input end N19 coupled to an output end of the first operational amplifier 2062 and a gate N9 of the N-type FET M9, and an output end coupled to the first input end of the first operational amplifier 2062. The second impedance component 2065 comprises a first end N20 coupled to the input signal Si12. The second operational amplifier 2066 comprises a first input end (+) coupled to a second end N21 of the second impedance 2065, and a bias end N22 coupled to the reference voltage Vb1. The transconductance circuit 2067 comprises an input end N23 coupled to an output end of the second operational amplifier 2066 and a gate N10 of the N-type FET M10, and an output end coupled to the first input end of the second operational amplifier 2066. In addition, the first reference current generating circuit 2064 coupled to an output end N17 of the transconductance circuit 2063 provides a first reference current Id11. The second reference current generating circuit 2068 coupled to an output end N21 of the transconductance circuit 2067 provides a second reference current Id12. In this embodiment, the first reference current Id11 is designed as being equal or approximately equal to the second reference current Id12, the reference voltage Vb1 is approximately a DC signal, a resistance value of the first impedance component 2061 is equal or approximately equal to that of the second impedance component 2065.

The transconductance circuits 2063 and 2067 of the differential circuit 206 are realized by N-type FETs M11 and M12. The converting circuit 204 comprises an N-type FET differential pair M13 and M14, a first load 2042, an N-type FET differential pair M15 and M16, and a second load 2044. A gate N13 of the N-type FET M13 is coupled to a gate N15 of the N-type FET M16, and a gate of the N-type FET M14 is coupled to a gate N14 of the N-type FET M15, so as to form input ports N13, N14 and N15 for receiving the clock signal Slo1 as shown in FIG. 2. The first load 2042 is coupled to a drain N24 of the N-type FET M13 and the N-type FET M15, the second load 2044 is coupled to a drain N25 of the N-type FET M14 and the N-type FET M16, and the drains N24 and N25 are for outputting an output signal Sout1. In addition, the mixer 200 is operated between a power voltage Vdd2 and a ground voltage Vgnd2.

Figure 3:
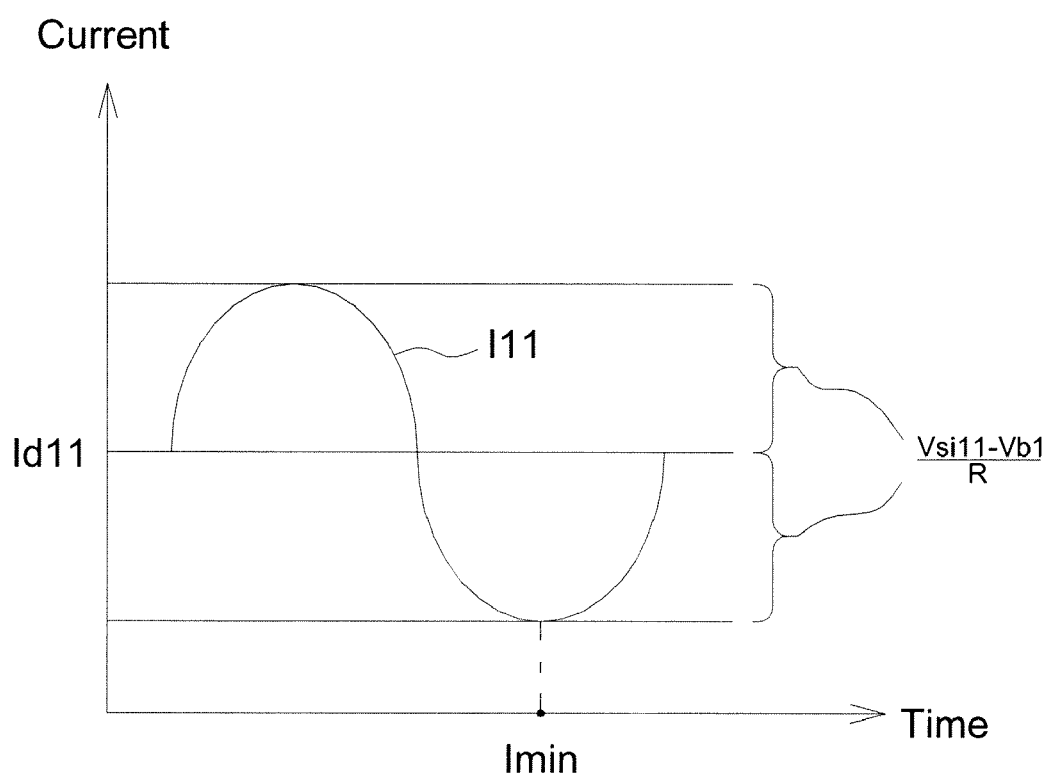
FIG. 3 is a waveform diagram of a current of the mixer in FIG. 2.

When the differential input signals Si11 and Si12 are transmitted to the mixer 200, the differential circuit 206 receives the input signals Si11 and Si12, and generates the first voltage signal Sp11 and the second voltage signal Sp12. The transconductance circuit 202 respectively transconducts the first voltage signal Sp 11 and the second voltage signal Sp12 to the first current signal Sc11 and the second current signal Sc12. The converting circuit 204 converts the first current signal Sc11 and the second current signal Sc12 to the output signal Sout1. More specifically, since the operational amplifier 2062, the N-type FET M11 and the first impedance component 2061 form a negative feedback system, a voltage at the second end N17 of the first impedance component 2061 is equal or approximately equal to the reference voltage Vb1. When the input signal Si11 is inputted at the first end N16, a current I11 flowing into the N-type FET M11 is calculated as:

$$I11 = Id11 + (Vsi11 - Vb1)/R1,$$

where Vsi11 represents a voltage value of the input signal Si11, and R1 represents a resistance value of the first impedance component. FIG. 3 shows a waveform of a current I11 in the mixer 200 in accordance with an embodiment of the present invention. The first reference current Id11 is DC components of the current I11, and (Vsi11−Vb1)/R1 is alternating current (AC) components carried by the first reference current Id11. In other words, the AC components (i.e., Vsi11−Vb1) R1) of the first reference current Id11 become larger as the larger a swing of the input signal Si11 gets. Under ideal situations, the swing of the input signal Si11 has a linear relationship with a swing of the AC components carried by the first reference current Id11. However, when the swing of the input signal Si11 is beyond a predetermined voltage swing, the swing of the AC components carried by the first reference current Id11 cannot maintain the linear relationship with the swing of the input signal Si11 since the swing of the AC components is at a minimum current end Imin. In order to increase amplitude of the swing of the AC components carried by the first reference current Id11, the mixer 200 according to the present invention implements an adjustable circuit for the first reference current generating circuit 2064, which is coupled to a drain of the N-type FET M11. Referring to FIG. 3, the amplitude of the swing of the AC components carried by the first reference current Id11 is increased by increasing the first reference current Id11 generated by the first reference current generating circuit 2064. In other words, compared to the embodiment in FIG. 1, the swing of the input signal Si11 carried by the mixer 200 in FIG. 3 is determined by an overdrive voltage between the drain and the source of the N-type FET M11, and the first reference current Id11 generated by the first reference current generating circuit 2064 is increased by adjusting the overdrive voltage between the drain and the source of the N-type FET M11 as desired according to design requirements to increase the swing of the input signal Si11 carried by the mixer 200.

It is to be noted that, at the input end N19 of the N-type FET M11, a variance in the first voltage signal Sp 11 has a corresponding transconductance relationship with a variance in the current I11 due to electric characteristics of the N-type FET M11. The first voltage signal Sp11 controls the N-type FET M9 to generate the corresponding first current signal Sc11. In other words, the N-type FET M9 mirrors the current I11 of the N-type FET M11 to generate the first current signal Sc11, which is transmitted to the N-type FET differential pair M13 and M14. Similar to the embodiment in FIG. 1, in this embodiment, a switch between the N-type FET differential pair M13 and M14 is switched according to the clock signal Slo1 to respectively output information of the first current signal Sc11 to the drains N24 and N25. Likewise, the input signal Si12 is transmitted to the drains N24 and N25 via the same approach. Therefore, the output signal Sout1 simultaneously obtains information of the input signals Si1 and Si12, and has a mixed frequency from frequencies of the input signals Si11 and Si12.

Figure 4:
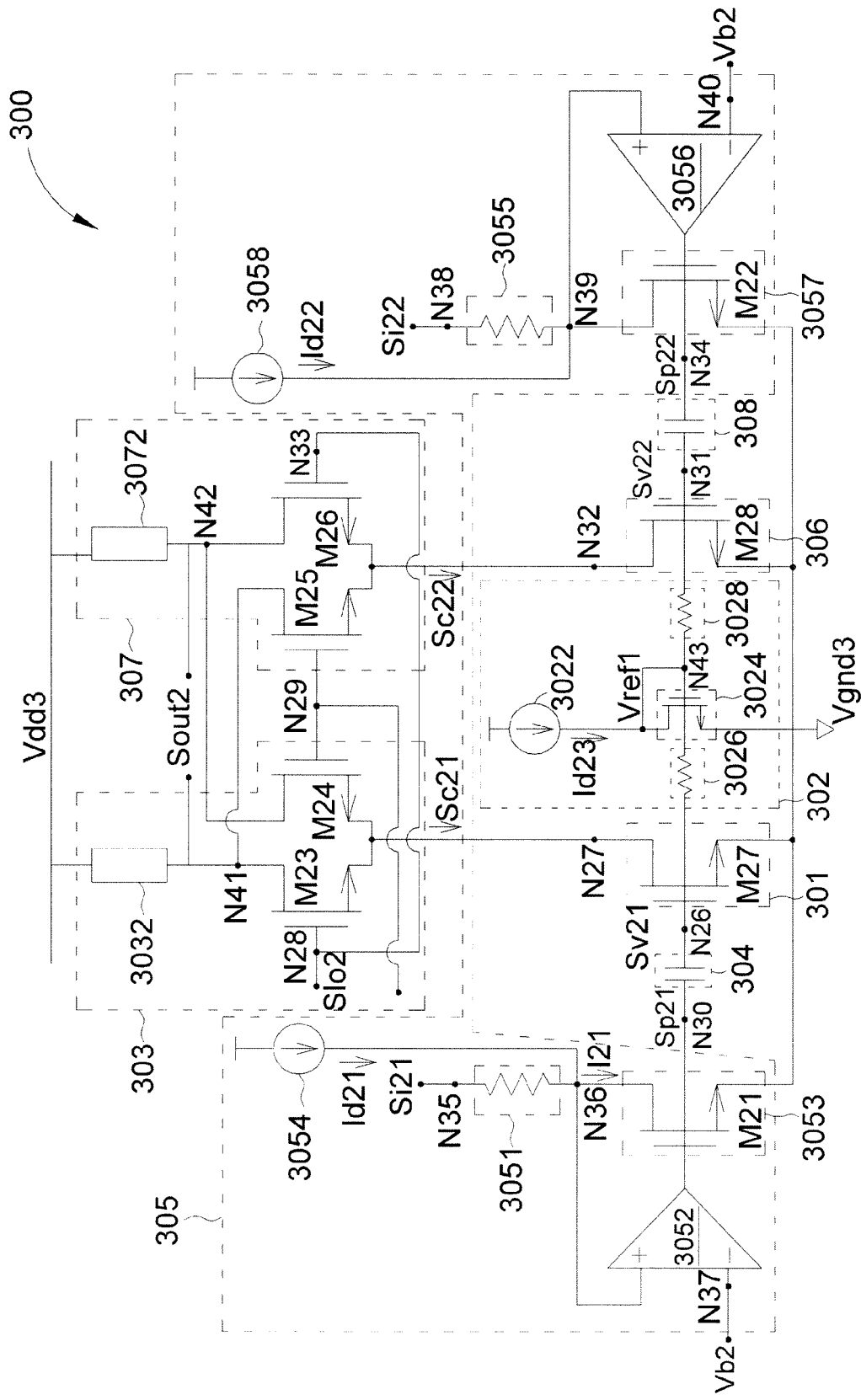
FIG. 4 is a circuit of a mixer in accordance with a second embodiment of the present invention.

FIG. 4 shows a circuit of a mixer 300 in accordance with an embodiment of the present invention. It is to be noted that, in order to illustrate the spirit of the present invention, the mixer 300 is represented by a differential form; however, it shall not be construed as limiting the present invention. The mixer 300 comprises a first transconductance circuit 301, a reference voltage generating circuit 302, a first converting circuit 303, a first capacitor 304, a differential circuit 305, a second transconductance circuit 306, a second converting circuit 307, and a second capacitor 308. The first converting circuit 303, the differential circuit 305 and the second transconductance circuit 307 of the mixer 300 are similar to the converting circuit 204 and the differential circuit 206 of the mixer 200, and shall not be described for brevity. The transconductance circuit 301 has an input end N26 for receiving and converting a first voltage signal Sv21 to a first current signal Sc21, and an output end N27 for outputting the first current signal Sc21. The reference voltage generating circuit 302 coupled to the input end N26 of the first transconductance circuit 301 generates a first reference voltage Vref1 at the input end N26 of the first transconductance circuit 301. The first capacitor 304 comprises a first end coupled to the input end N26 of the first transconductance circuit 301, and a second end N30 for receiving a first processed signal Sp21. The first capacitor 304, as a DC filter, generates a first voltage signal Sv21 by filtering DC component of the first processed signal Sp21. The differential circuit 305 coupled to the first capacitor 304 receives an input signal (comprising differential signals Si21 and Si22) to generate the first processed signal Sp21. The second transconductance circuit 306 comprises an input end N31 for receiving and converting a second voltage signal Sv22 to a second current signal Sc22, and an output end N32 for outputting the second current signal Sc22 to the second transconductance circuit 306. The second capacitor 308 comprises a first end coupled to an input end N31 of the second transconductance circuit 306, and a second end N34 for receiving a second processed signal Sp22 to generate the second voltage signal Sv22 according to the second processed signal Sp22. In addition, the differential circuit 305 is coupled to the second capacitor 308 to generate the second processed signal Sp22 according to the input signal, and the reference voltage generating circuit 302 is coupled to the input end N31 of the second transconductance circuit 306 to generate the first reference voltage Vref1 at the input end N31 of the second transconductance circuit 306.

The first transconductance circuit 301 and the second transconductance circuit 306 are respectively realized by N-type FETs M27 and M28. A gate N28 of the N-type FET M23 is coupled to a gate N33 of the N-type FET M26, and a gate of the N-type FET M24 is coupled to a gate N29 of the N-type FET M25, so as to form input ports N28, N29 and N33 for receiving a clock signal Slo2 as shown in FIG. 4. The first load 3032 is coupled to a drain N41 of the N-type FET M23 and the N-type FET M25, the second load 3072 is coupled to a drain N42 of the N-type FET M24 and the N-type FET M26, and the drains N41 and N42 are for outputting an output signal Sout2. In addition, the mixer 300 is operated between a power voltage Vdd3 and a ground voltage Vgnd3.

The reference voltage generating circuit 302 comprises a reference current generating circuit 3022, a diode-connected N-type FET 3024, a first impedance component 3026, and a second impedance component 3028. The reference current generating circuit 3022 generates a reference current Id23. The N-type FET 3024 comprising a reference end N43 coupled to the reference current generating circuit 3022 generates the first reference voltage Vref1 at the reference end N43 according to the reference current Id23. The first impedance component 3026 comprises a first end coupled to the reference end N43 of the N-type FET 3024, and a second end pint coupled to the input end N26 of the first transconductance circuit 301. The second impedance component 3028 comprises a first end coupled to the reference end N43 of the N-type FET 3024, and a second end coupled to the input end pint N31 of the second transconductance circuit 306.

When the differential signals Si21 and Si22 are transmitted to the mixer 300, the differential circuit 305 receives the input signals Si21 and Si22, and generates the first processed signal Sp21 and the second processed signal Sp22. AC components of the first processed signal Sp21 and the second processed signal Sp22 are converted to the first voltage signal Sv21 and the second voltage signal Sv22 via the first capacitor 304 and the second capacitor 308. The first transconductance circuit 301 and the second transconductance circuit 306 respectively transconduct the first voltage signal Sv21 and the second voltage signal Sv22 to the first current signal Sc21 and the second current signal Sc22. The first converting circuit 303 and the second converting circuit 307 respectively convert the first current signal Sc21 and the second current signal Sc22 to the output signal Sout2. More specifically, since the first operational amplifier 3052, the N-type FET M21 and the first impedance component 3051 form a negative feedback system, a voltage at a second end N36 of the first impedance component 3051 is equal or approximately equal to a reference voltage Vb2. When the input signal Si21 is inputted at the first end pint N35, a current I21 flowing into the N-type FET M21 is represented as:

$$I21 = Id21 + (Vsi21 - Vb2)/R2,$$

where Vsi21 represents a voltage value of the input signal Si21, and R2 represents a resistance value of the first impedance component 3051. Similar to the embodiment of the present invention in FIG. 2, the first reference current Id21 is DC components of the current I21, and (Vsi21−Vb2)/R2 is AC components carried by the first reference current Id21. Therefore, a swing of the AC components (i.e., (Vsi21−Vb2)/R2) carried by the first reference current Id21 becomes larger as the larger a swing of the input signal Si21 gets. Under ideal situations, the swing of the input signal Si21 has a linear relationship with a swing of the AC components carried by the first reference current Id21. However, when the swing of the input signal Si21 is beyond a predetermined voltage swing, the swing of the AC components carried by the first reference current Id21 cannot maintain the linear relationship with the swing of the input signal Si21. In order to increase a degree of the swing of the AC components carried by the first reference current Id21, the mixer 300 according to the present invention implements the adjustable first reference current generating circuit 3054, which is coupled to a drain of the N-type FET M21. The amplitude of the swing of the AC components carried by the first reference current Id21 is increased by increasing the first reference current Id21 generated by the first reference current generating circuit 3054. In other words, compared to the embodiment in FIG. 1, the swing of the input signal Si21 carried by the mixer 300 in FIG. 3 is determined by an overdrive voltage between the drain and a source of the N-type FET M21, and the first reference current Id21 generated by the first reference current generating circuit 3054 is increased by adjusting the overdrive voltage between the drain and the source of the N-type FET M21 as desired according to design requirements to increase the swing of the input signal Si21 carried by the mixer 300.

It is to be noted that, in this embodiment, bias voltages of the first transconductance circuit 301 and the second transconductance circuit 306 are generated by the reference voltage generating circuit 302. At the input end N30 of the N-type FET M21, a variance in the first processed signal Sp21 has a corresponding transconductance relationship with a variance in the current I21 due to electrical characteristics of the N-type FET M21. The first voltage signal Sv11 controls the N-type FET M27 to generate the corresponding first current signal Sc21, which is transmitted to the N-type FET differential pair M23 and M24. Similar to the embodiment in FIG. 1, in this embodiment, a switch between the N-type FET differential pair M23 and M24 is switched according to the clock signal Slo2 to respectively output information of the first current signal Sc21 to the drains N41 and N42. Likewise, the input signal Si22 is transmitted to the drains N41 and N42 via the same approach. Therefore, the output signal Sout2 simultaneously obtains information of the input signals Si21 and Si22, and has a mixed frequency from frequencies of the input signals Si21 and Si22.

Figure 1:
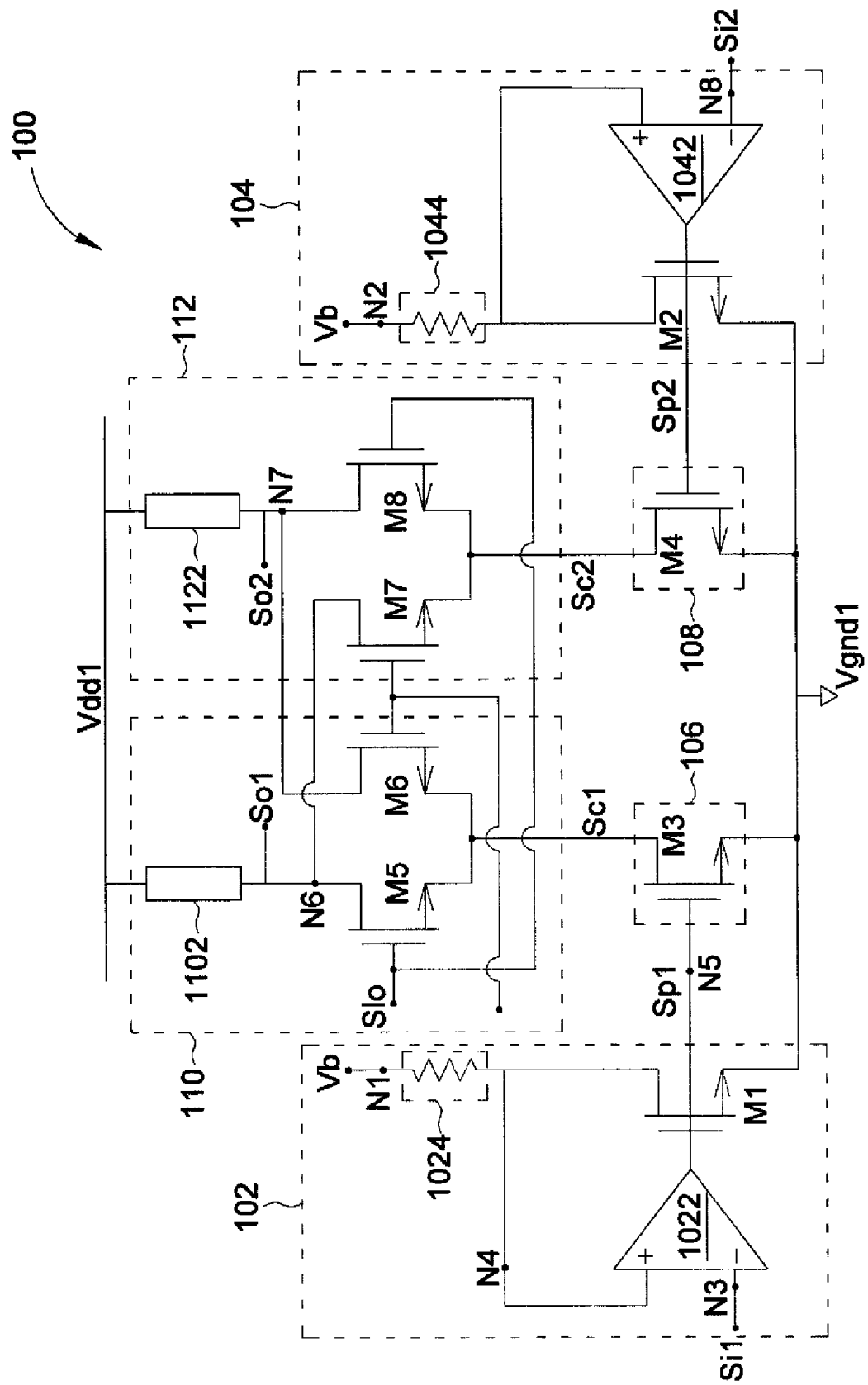
FIG. 1 is a circuit of a mixer in accordance with the prior art.

A relationship between a DC offset and an LO leakage is described below in detail. Referring to FIG. 1, supposing that circuits prior to the transconductance circuit (M3, M4) accumulates a DC offset Vos at an input end of the transconductance circuit (M3, M4) due to a mismatch effect, a relationship that an LO leakage is generated at an output end (N6, N7) as a result of the DC offset is represented by:

$$So1 = \alpha[(A_{IF}\text{Cos}\omega_{IF}t + V_{OS}) \cdot (A_{LO}\text{Cos}\omega_{LO}t) +$$
$$(-A_{IF}\text{Cos}\omega_{IF}t) \cdot (-A_{LO}\text{Cos}\omega_{LO}t)] = \alpha[A_{IF}A_{LO}\text{Cos}(\omega_{LO} + \omega_{IF})t +$$
$$A_{IF}A_{LO}\text{Cos}(\omega_{LO} - \omega_{IF})t + V_{OS}A_{LO}\text{Cos}\omega_{LO}t]$$

$$So2 = \alpha[(-A_{IF}\text{Cos}\omega_{IF}t) \cdot (A_{LO}\text{Cos}\omega_{LO}t) +$$
$$(A_{IF}\text{Cos}\omega_{IF}t + V_{OS}) \cdot (-A_{LO}\text{Cos}\omega_{LO}t)] =$$
$$-\alpha[A_{IF}A_{LO}\text{Cos}(\omega_{LO} + \omega_{IF})t + A_{IF}A_{LO}\text{Cos}(\omega_{LO} - \omega_{IF})t +$$
$$V_{OS}A_{LO}\text{Cos}\omega_{LO}t]$$

$$So1 - So2 = 2\alpha[A_{IF}A_{LO}\text{Cos}(\omega_{LO} + \omega_{IF})t +$$
$$A_{IF}A_{LO}\text{Cos}(\omega_{LO} - \omega_{IF})t + \overline{V_{OS}A_{LO}\text{Cos}\omega_{LO}t}^{\text{LO Leakage}}]$$

As mentioned above, the LO leakage generated at an output end of the mixer (110, 112) along with the DC offset of the input signal is directly proportional to the DC offset. Since a communication quality of a wireless system is undesirably influenced by the LO leakage, it is extremely important to restrain the DC offset. In other words, in FIG. 1, the mismatch between the input circuit (102, 104) and the DC offset previously accumulated are mixed with a clock signal of the converting circuit (110, 112) through the input end of the transconductance circuit (106, 108) to generate the LO leakage at the output end (N6, N7).

Referring to FIG. 4, in this embodiment, since the first capacitor 304 and the second capacitor 308, as DC filters, cut off the DC current from the differential circuit 305, a DC offset caused by an offset area between the N-type FET M21 and the N-type FET M22 and a DC offset caused by an offset area between the operational amplifier 3052 and the operational amplifier 3056 cannot be transmitted to the first converting circuit 303 and the second converting circuit 307. Accordingly, compared to the embodiment of the present invention in FIG. 1, in addition to carrying the input signals Si21 and Si22 comprising larger swings, the mixer 300 also significantly reduces an equivalent offset (i.e., Vos1/Y1) caused by the offset areas of other circuits to accordingly reduce the LO leakage.

Figure 5:
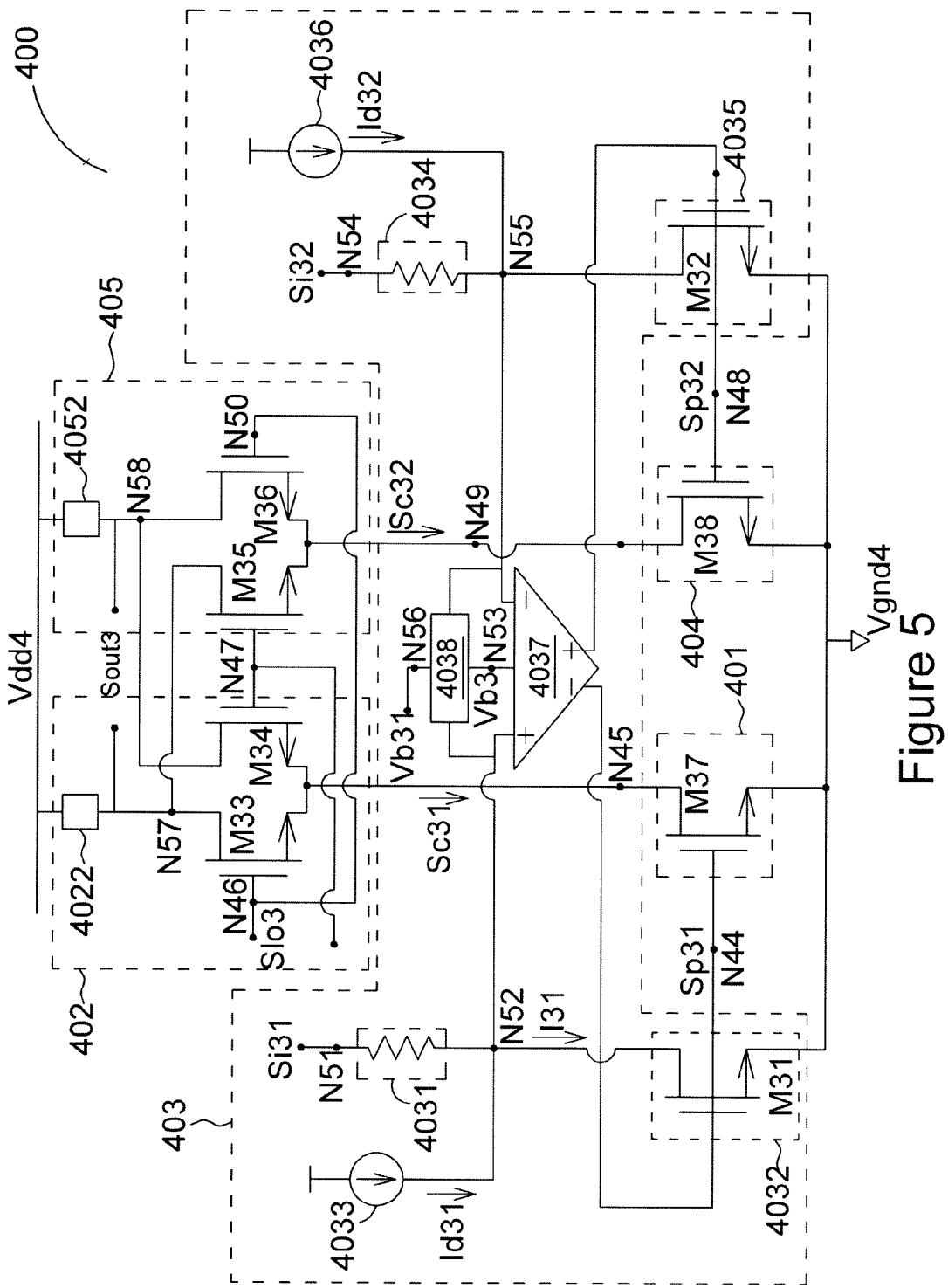
FIG. 5 is a circuit of a mixer in accordance with a third embodiment of the present invention.

FIG. 5 shows a mixer 400 in accordance with an embodiment of the present invention. It is to be noted that, in order to illustrate the spirit of the present invention, the mixer 400 is represented by a differential form; however, it shall not be construed as limiting the present invention. The mixer 400 comprises a first transconductance circuit 401, a first converting circuit 402, a differential input circuit 403, a second transconductance circuit 404, and a second converting circuit 405. Connections between circuits of the mixer 400 are as illustrated in FIG. 5 in detail. The first transconductance circuit 401, the first converting circuit 402, the second transconductance circuit 404, and the second converting circuit 405 of the mixer 400 are respectively similar to the first transconductance circuit 301, the first converting circuit 303, the second transconductance circuit 306 and the second converting circuit 307 of the mixer 300, and shall not be described for brevity. The following description mainly focuses on technical characteristics of the differential input circuit 403, and the entire technical characteristics of the mixer 400 are apparent to a person having ordinary skill in the art after having read the technical characteristics of the mixer 300. The differential input circuit 403, coupled to the first transconductance circuit 401, is for receiving an input signal comprising differential input signals Si31 and Si32 to generate a first voltage signal Sp31.

The differential input circuit 403 comprises a first impedance component 4031, a transconductance circuit 4032, a first reference current generating circuit 4033, a second impedance component 4034, a transconductance circuit 4035, a second reference current generating circuit 4036, an operational amplifier 4037, and a CMFB circuit 4038. The first impedance component 4031 has a first end N51 coupled to the input signal Si31. The operational amplifier 4037 comprises a first input end (+) coupled to a second end N52 of the first impedance component 4031, and a bias end N53 coupled to a reference voltage Vb3 generated by the CMFB circuit 4038. The transconductance circuit 4032 comprises an input end coupled to an output end (−) N44 of the operational amplifier 4037, and an output end coupled to the first input end N52 of the operational amplifier 4037. The second impedance component 4034 comprises a first end N54 coupled to the input signal Si32. The operational amplifier 4037 comprises a second input end (−) coupled to a second end N55 of the second impedance component 4034. The transconductance circuit 4035 comprises an input end coupled to an output end (+) N48 of the operational amplifier 4037, and an output end coupled to the second input end N55 of the operational amplifier 4037. In addition, the first reference current generating circuit 4033 coupled to the output end N52 of the transconductance circuit 4032 provides a first reference current Id31; the second reference current generating circuit 4036 coupled to the output end N55 of the transconductance circuit 4035 provides a second reference current Id32. In this embodiment, the first reference current Id31 is designed as being equal or approximately equal to the second reference current Id32, the reference voltage Vb3 is a DC signal, and a resistance value of the first impedance component 4031 is equal or approximately equal to that of the second impedance component 4034. The CMFB circuit 4038 comprises: a first input end coupled to the first input end N52 of the operational amplifier 4037; a second input end coupled to the second input end N55 of the operational amplifier 4037; an output end, coupled to the bias end N53 of the operational amplifier 4037, for outputting the first reference voltage Vb3; and a third input end N56 for receiving a second reference voltage Vb31. The CMFB circuit 4038 adjusts the first reference voltage Vb3 according to a voltage difference between a common mode voltage of the input voltages Si31 and Si32 and the second reference voltage Vb31, so that the common mode voltage of the input voltages Si31 and Si32 remains approximately unchanged. The transconductance circuits 4032 and 4035 are respectively realized by the N-type FETs M31 and M32.

When the differential input signals Si31 and Si32 are transmitted to the mixer 400, the differential input circuit 403 receives the input signals Si31 and Si32, and generates the first voltage signal Sp31 and a second voltage signal Sp32. The first transconductance circuit 401 and the second transconductance circuit 404 respectively transconduct the first voltage signal Sp31 and the second voltage signal Sp32 to a first current signal Sc31 and a second current signal Sc32. The first converting circuit 402 and the second converting circuit 405 respectively converts the first current signal Sc31 and the second current signal Sc32 to an output current Sout3. More specifically, since the operational amplifier 4037, the N-type FET M31, the first impedance component 4031, the N-type FET M32, the second impedance component 4034 and the CMFB circuit 4038 form a differential negative feedback system, a voltage at the second end N52 of the first impedance component 4031 is equal or approximately equal to that at the second end N55 of the second impedance component 4034. In addition, similar to the mixer 300, the first reference current generating circuit 4033 and the second reference current generating circuit 4036 of the mixer 400 are for increasing swings of the input signals Si31 and Si32 carried by the mixer 400, and operation principles thereof are similar to the foregoing description of the mixer 300 and shall not be described for brevity.

Figure 6:
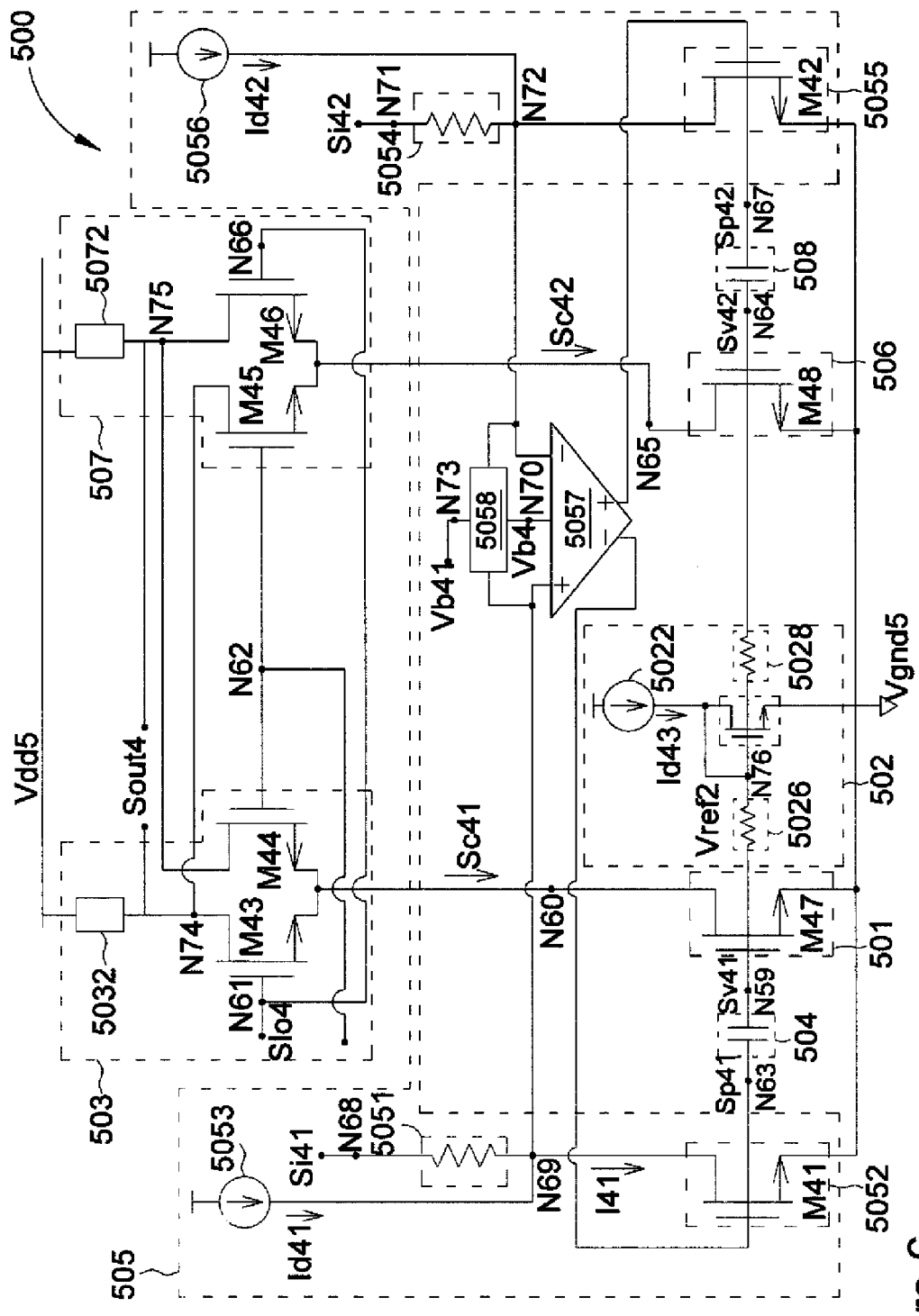
FIG. 6 is a circuit of a mixer in accordance with a fourth embodiment of the present invention.

FIG. 6 shows a circuit of a mixer 500 in accordance with an embodiment of the present invention. It is to be noted that, in order to illustrate the spirit of the present invention, the mixer 500 is represented by a differential form; however, it shall not be construed as limiting the present invention. The mixer 500 comprises a first transconductance circuit 501, a reference voltage generating circuit 502, a first converting circuit 503, a first capacitor 504, a differential input circuit 505, a second transconductance circuit 506, a second converting circuit 507, and a second capacitor 508. In addition, since the first transconductance circuit 501, the reference voltage generating circuit 502, the first transconductance circuit 503, the first capacitor 504, the second transconductance circuit 506, the second converting circuit 507 and the second capacitor 508 of the mixer 500 are respectively similar to the first transconductance circuit 301, the reference voltage generating circuit 302, the first converting circuit 303, the first capacitor 304, the second transconductance circuit 306 and the second converting circuit 307 of the mixer 300, and the differential input circuit 505 of the mixer 500 is similar to the differential input circuit 403 of the mixer 400, details of the mixer 500 shall not be described for brevity. The overall technical characteristics of the mixer 500 are apparent to a person having ordinary skill in the art after having read the technical characteristics of the mixer 300 and the mixer 400.

Similar to the mixer 300 and the mixer 400, a first reference current generating circuit 5053 and a second reference current generating circuit 5056 of the mixer 500 are for increasing swings of input signals Si41 and Si42, and operation principles thereof are similar to the foregoing description of the mixer 300 and shall not be described for brevity. In this embodiment, since an N-type FET M42, a second impedance component 5054 and a CMFB circuit 4038 form a differential negative feedback system, a voltage at a second end N69 of a first impedance component 5051 is equal or approximately equal to that at a second end N72 of a second impedance component 5054. In addition, in this embodiment, since the first capacitor 504 and the second capacitor 508 cut off a DC current from the differential input circuit 505, a DC offset caused by an offset area between a N-type FET M41 and the N-type FET M42 and a DC offset caused by an offset area of an operational amplifier 5057 cannot be transmitted to the first converting circuit 503 and the second converting circuit 507. Accordingly, compared to the embodiment of the present invention in FIG. 1, in addition to carrying the input signals Si41 and Si42 having larger swings, the mixer 500 also significantly reduces an equivalent offset caused by the offset areas of other circuits to accordingly reduce an LO leakage.

Figure 7:
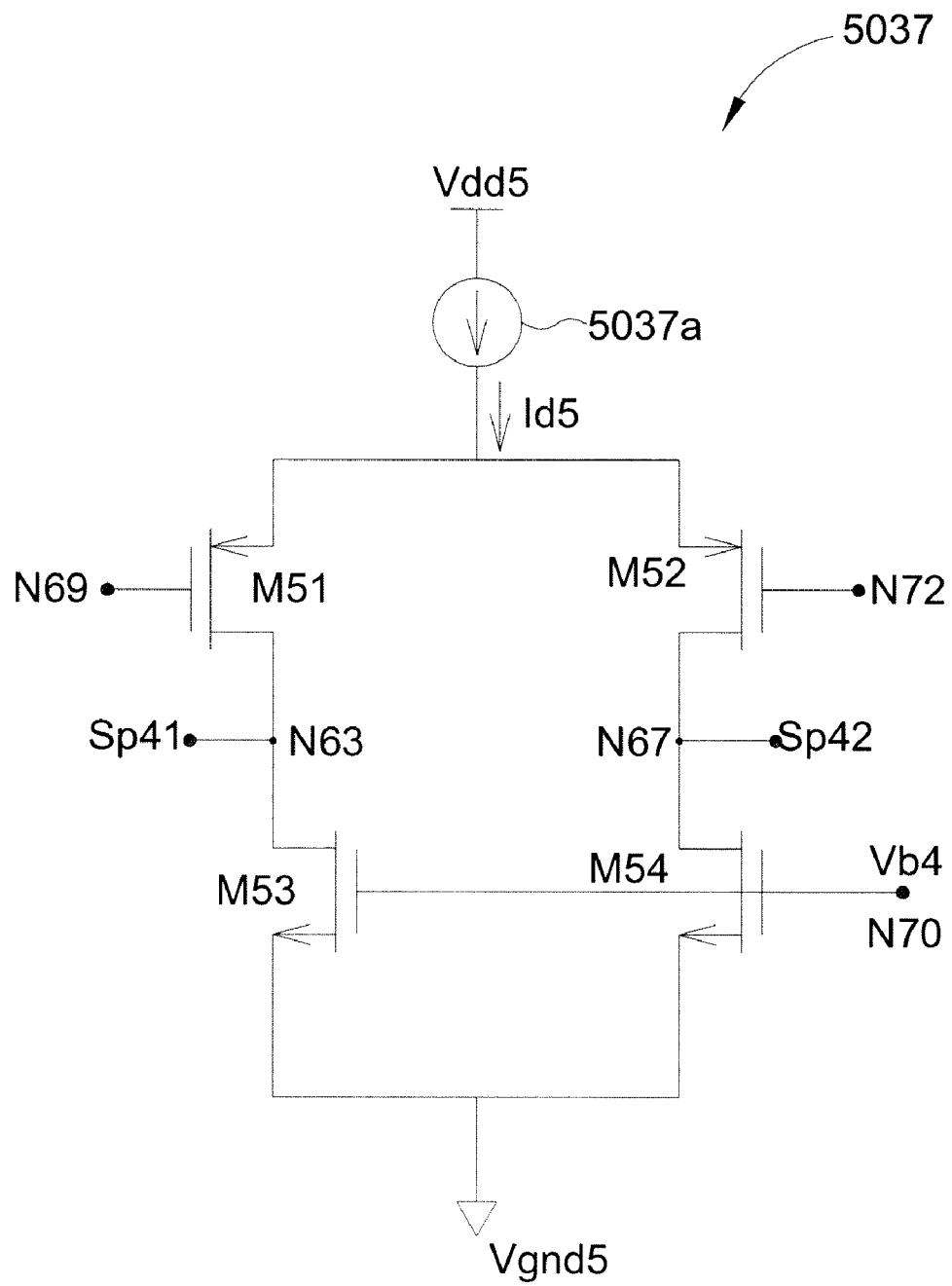
FIG. 7 is a circuit of an operational amplifier of the mixer in FIG. 6 in accordance with an embodiment of the present invention.

FIG. 7 shows a circuit of the operational amplifier 4037 of the mixer 400 and the operational amplifier 5057 of the mixer 500 in accordance with an embodiment of the present invention. Taking the operational amplifier 5037 as an example, the operational amplifier 5037 is a cascaded operational amplifier comprising a P-type FET differential pair M51 and M52, N-type FETs M53 and M54, and a reference current source 5037a which generates a bias current Id5 to the P-type FET differential pair M51 and M52. The N-type FETs M53 and M54 adjust DC bias voltages of the first processed signal Sp41 and the second processed signal Sp42 according to a reference voltage Vb4 generated by a CMFB circuit 5058.

Figure 8:
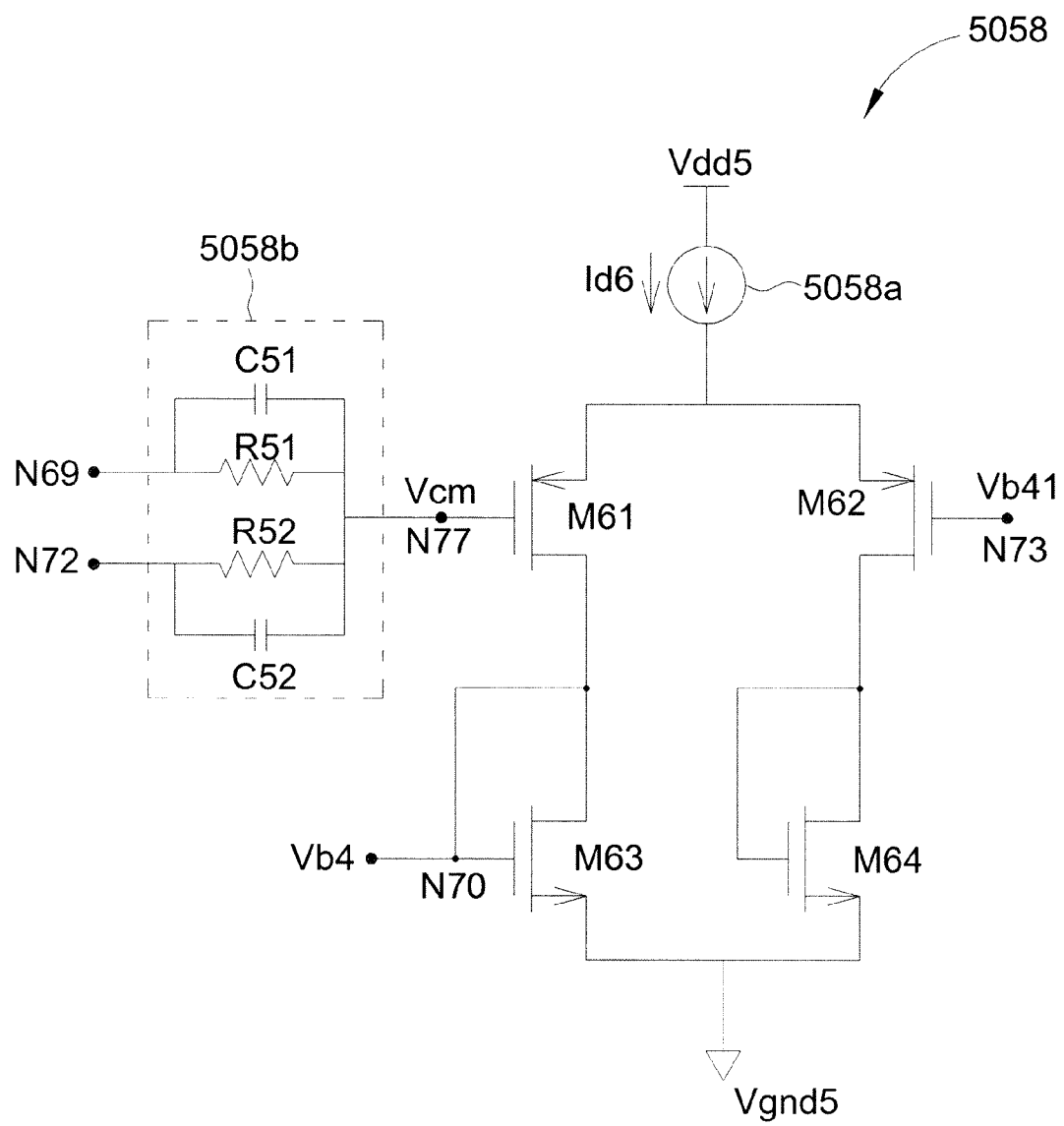
FIG. 8 is a circuit of a common mode feedback (CMFB) circuit of the mixer in FIG. 6 in accordance with an embodiment of the present invention.

FIG. 8 shows a circuit of the CMFB circuit 4038 of the mixer 400 and the CMFB circuit 5058 of the mixer 500 in accordance with an embodiment of the present invention. Taking the CMFB circuit 5058 as an example, the CMFB circuit 5058 comprises a P-type FET differential pair M61 and M62, N-type FETs M63 and M64, a reference current source 5058a, and a common mode voltage filtering circuit 5058b. The reference current source 5058a generates a bias current Id6 to the P-type FET differential pair M61 and M62, and the common mode voltage filtering circuit 5058b comprises capacitors C51 and C52, and resistors R51 and R52. Connections between the foregoing components are as shown in FIG. 8. The common mode voltage filtering circuit 5058b outputs a common mode voltage Vcm of the differential input signals Si41 and Si43 at an end N77. The P-type FET differential pair M61 and M62 compares the common mode voltage Vcm with the second reference voltage Vb41 to generate the reference voltage Vb4. It is to be noted that, in this embodiment, a capacitance value of the capacitor C51 is equal or approximately equal to that of the capacitor C52, and a resistance value of the resistor R51 is equal or approximately equal to that of the resistor R52. Accordingly, the CMFB circuit 5058, the operational amplifier 5037, the N-type FETs M41 and M42, the first impedance component 5051 and the second impedance component 5054 form a differential negative feedback system, such that the differential input signals Si41 and Si42 are accurately transmitted to the first transconductance circuit 501 and the second transconductance circuit 506 for subsequent processing.

In conclusion, the mixer 200 and the mixer 400 according to the present invention adjust DC bias voltages of input signals by using adjustable current generating circuits (2064, 2068, 4033 and 4036) to improve linearity of the mixer 200 and the mixer 400. The mixer 300 and the mixer 500 according to the present invention adjust DC bias voltages of input signals by using adjustable current generating circuits (3054, 3058, 5053 and 5056) to improve linearity of the mixer 300 and the mixer 500, and cut off offset voltages from an input circuit to reduce an LO leakage of the mixer 300 and the mixer 500.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A signal processing circuit, comprising:
    a differential input circuit comprising a first input circuit and a second input circuit for receiving a first input signal and a second input signal to generate a first processed signal and a second processed signal respectively;
    a first reference current generating circuit for providing a first reference current to control an allowable swing amplitude of the first input signal and the second input signal;
    a first DC filter and a second DC filter, respectively coupled to the first and the second input circuits, for receiving the first and the second processed signals to output a first voltage signal and a second voltage signal:
    a differential transconductance circuit comprising a first transconductance circuit and a second transconductance circuit, respectively coupled to the first and the second DC filters, for converting the first and the second voltage signals to first and second current signals; and
    a differential converting circuit comprising a first converting circuit and a second converting circuit, respectively coupled to the first and the second transconductance circuits, for mixing the first and the second current signals with first and second clock signals to generate first and second output signals;
    wherein the first and the second input signals are a differential signal pair, the first and the second clock signals are a differential signal pair, and the first and the second output signals are a differential signal pair.

2. The signal processing circuit as claimed in claim 1, further comprising a reference voltage generating circuit for generating a first reference voltage to the first and the second transconductance circuits.

3. The signal processing circuit as claimed in claim 2, wherein the reference voltage generating circuit comprises:
    a second reference current generating circuit, for providing a second reference current; and a diode-connected transistor, coupled to the second reference current generating circuit, for generating the first reference voltage according to the second reference current.

4. The signal processing circuit as claimed in claim 3, wherein the reference voltage generating circuit further comprises:
a first impedance component, comprising a first end coupled to the diode-connected transistor, and a second end coupled to the first transconductance circuit and the first DC filter; and
a second impedance component, comprising a first end coupled to the diode-connected transistor, and a second end coupled to the second transconductance circuit and the second DC filter.

5. The signal processing circuit as claimed in claim 1, wherein the differential input circuit further comprises:
an operational amplifier, comprising a positive input end, a negative input end, a positive output end, a negative output end, a bias input end; and
a common mode feedback (CMFB) circuit, coupled to the positive input end, the negative input end and the bias input end of the operational amplifier, and a reference voltage, for outputting a bias voltage to the operational amplifier according to the reference voltage and a voltage difference between the positive input end and the negative input end to maintain the common mode voltage of the input signal substantially constant;
wherein the first input circuit comprises:
a first impedance component, comprising a first end coupled to the first input signal, and a second end coupled to the positive end of the operational amplifier; and
a third transconductance circuit, comprising an input end coupled to the negative output end of the operational amplifier and the second end of the first DC filter, and an output end coupled to the positive input end of the operational amplifier; and
the second input circuit comprising:
a second impedance component, comprising a first end coupled to the second input signal, and a second end coupled to the negative end of the operational amplifier; and
a fourth transconductance circuit, comprising an input end coupled to the positive output end of the operational amplifier and the second end of the second DC filter, and an output end coupled to the negative input end of the operational amplifier.

6. The signal processing circuit as claimed in claim 1, wherein the first input circuit comprises:
an impedance component, comprising a first end coupled to the first input signal and a second end;
an operational amplifier, comprising a first input end, coupled to the second end of the impedance component, a second input end coupled to a reference voltage, and an output end; and
a third transconductance circuit, for generating the first processed signal to the first DC filter, comprising an input end coupled to the output end of the operational amplifier and the first DC filter, and an output end coupled to the first input end of the operational amplifier;
wherein, the reference voltage is a direct current (DC) voltage.

7. The signal processing circuit as claimed in claim 6, wherein the first transconductance circuit is a first field effect transistor (FET), the third transconductance circuit is a third FET, and a first aspect ratio of the first FET is greater than a second aspect ratio of the third FET.

8. A signal processing circuit, comprising:
a first input circuit for receiving a first input signal to generate a first voltage, comprising
a first impedance component, comprising a first end for receiving the first input signal and a second end;
a first operational amplifier, comprising a first input end coupled to the second end of the first impedance component, a second input end coupled to a first reference voltage, and an output end; and
a third transconductance circuit, comprising an input end coupled to the output end of the first operational amplifier, and an output end coupled to the second end of the first impedance component;
a second input circuit for receiving a second input signal to generate a second voltage signal, comprising
a second impedance component, comprising a first end coupled to the second input signal and a second end;
a second operational amplifier, comprising a first input end coupled to the second end of the second impedance component, a second input end coupled to the first reference voltage, and an output end; and
a fourth transconductance circuit, comprising an input end coupled to the output end of the second operational amplifier, and an output end coupled to the second end of the second impedance component;
a differential transconductance circuit comprising first and second transconductance circuits, respectively coupled to the output end of the first and the second operational amplifiers, for converting the first and the second voltage signals to first and second current signals; and
a differential converting circuit comprising first and second converting circuits, respectively coupled to the first and the second transconductance circuits, for mixing the first and the second current signals with first and second clock signals to generate a first and a second output signals;
wherein the first and the second input signals are a differential signal pair, the first and the second clock signals are a differential signal pair, and the first and the second output signals are a differential signal pair, and
wherein the first input circuit further comprises a first reference current generating circuit, coupled to the second end of the first impedance component, for providing a first reference current, and the second input circuit further comprises a second reference current generating circuit, coupled to the second end of the second impedance component, for providing a second reference current.

9. The signal processing circuit as claimed in claim 8, further comprising:
a first DC filter coupled between the first input circuit and the first transconductance circuit; and
a second DC filter coupled between the second input circuit and the second transconductance circuit.

10. The signal processing circuit as claimed in claim 9, further comprising a reference voltage generating circuit for generating a first reference voltage to the first and the second transconductance circuits.

11. The signal processing circuit as claimed in claim 10, wherein the reference voltage generating circuit comprises:
a reference current generating circuit, for providing a reference current; and a diode-connected transistor, coupled to the reference current generating circuit, for generating the first reference voltage according to the reference current.

12. The signal processing circuit as claimed in claim 11, wherein the reference voltage generating circuit further comprises:

a first impedance component, comprising a first end coupled to the diode-connected transistor, and a second end coupled to the first transconductance circuit and the first DC filter; and a second impedance component, comprising a first end coupled to the diode-connected transistor, and a second end coupled to the second transconductance circuit and the second DC filter.

13. The signal processing circuit as claimed in claim 8, wherein the first transconductance circuit is a first FET, the third transconductance circuit is a second FET, and a first aspect ratio of the first FET is larger than a second aspect ratio of the third FET.

* * * * *